United States Patent [19]

Jones et al.

[11] 4,045,310

[45] Aug. 30, 1977

[54] STARTING PRODUCT FOR THE PRODUCTION OF A READ-ONLY MEMORY AND A METHOD OF PRODUCING IT AND THE READ-ONLY MEMORY

[75] Inventors: Robert K. Jones, Centerville, Ohio; Harry Sue, Chicago, Ill.

[73] Assignee: Teletype Corporation, Skokie, Ill.

[21] Appl. No.: 682,411

[22] Filed: May 3, 1976

[51] Int. Cl.$^2$ .................. C25F 3/00; C25F 3/14
[52] U.S. Cl. .................. 204/129.4; 204/129.3; 204/129.65
[58] Field of Search ............ 204/129.65, 129.4, 129.3, 204/248, 197

[56] References Cited

U.S. PATENT DOCUMENTS

| | | | |
|---|---|---|---|
| 3,245,051 | 4/1966 | Robb | 340/173 R |
| 3,529,299 | 9/1970 | Chung et al. | 340/173 R |
| 3,678,348 | 7/1972 | Reber et al. | 204/129.65 |
| 3,691,654 | 9/1972 | Siegel | 204/129.65 |
| 3,695,955 | 10/1972 | Jochems et al. | 156/11 |

Primary Examiner—T. M. Tufariello
Attorney, Agent, or Firm—W. G. Dosse; M. Pfeffer

[57] ABSTRACT

A read-only memory is manufactured from a matrix or array of multilayer electrical devices, each of which includes at least one metallic layer, a portion of which contacts a doped semi conductor region. The metallic layers are controllably and rapidly thinned down and decreased in cross-sectional area in the vicinity of the doped regions to form fusible links, thus producing a ROM starting product. Fusible link formation is enhanced by the use of an etchant for the metallic layer which forms an electrochemical cell in conjunction therewith and with the semiconductor and the doped region. Any metallic layers not contacting a doped region are also etched by the etchant, but at the much slower "chemical rate". Following the production of the starting product, a ROM may be produced by the selective application of voltages to selected fusible links, the $I^2R$ heating of the links fusing them, or blowing them out. In a preferred embodiment, the electrical devices are MOSFETS.

18 Claims, 4 Drawing Figures

STARTING PRODUCT FOR THE PRODUCTION OF A READ-ONLY MEMORY AND A METHOD OF PRODUCING IT AND THE READ-ONLY MEMORY

BACKGROUND OF THE INVENTION

1. Field of the Invention

This invention relates to read-only memories (ROM's), and more particularly to a starting product from which a ROM may be produced. Moreover, this invention also relates to a method of forming ROM starting products, and a method forming ROMS therefrom.

2. Description of the Prior Art

ROM's are well-known as are methods of making them. One method of making a ROM, of particular interest herein, involves the selective blowing out or fusing of fusible links which constitute a portion of metallic conductive layers in an electrical element so as to prevent selected ones of the elements from operating. The electrical element may be a resistor, a diode, or a unipolar or a bipolar transistor, usually of a multilayered configuration.

Common today are MOSFETS, using negative logic. The fusible links are usually portions of the conductive layers which are unable to carry as much current as the remainder of the layer. Generally speaking, the inability of a MOSFET to operate is thought of as storing a "0" therein. MOSFETS which are able to operate exhibit a "1" when appropriate voltages are applied thereto.

MOSFETS and other multilayered electrical elements are produced by photolithographic techniques which involve successive and repetitive deposition masking, and selective etching steps. The elements may each include a doped region in a body of semiconductor, various electrodes respectively contacting or being associated with appropriate sites of the body and/or region. When a ROM is to be produced, the individual elements are often interconnected by conductive layers or buses to form a matrix thereof. The conductive layers are often a continuation of, and are formed by the same steps as, the electrodes of the elements.

Fusible links in such structures have been formed in the conductive layers and/or the electrodes in numerous ways.

One way has been to deposit the conductive layers in part over small bumps or steps formed in an insulating layer to thin out the metal at this point. Another way has been to form part of the conductive layer over a dissolvable area, such as a photoresist bump, which is later dissolved to suspend the part in air thus decreasing the heat dissipative effects thereat. These prior art methods are discussed in U.S. Pat. No. Re. 28,481 which itself relates to formation of fusible links by deposition of thin, precisely defined and delineated fuse metal layers through an appropriate mask. Such fuse metal deposition is in addition to a subsequent, separate step of depositing the conductive layers, the two being selectively brought into contact through apertures formed in an insulating layer separating the fuse metal and the conductive layers.

The first two approaches, while desirable because they add no extra steps to the usual photolithographic sequence, produce links which fuse unpredictably or not at all. The third approach adds an extra metal layer (the fuse metal) and an additional insulating layer and therefore adds additional steps to the usual photolithographic sequence.

Another approach is to decrease the cross-sectional area of selected parts of the busses after their formation. See U.S. Pat. Nos. Re. 28,481 and 3,529,299. Such decrease is effected by a necking down of the bus, usually by an extra masking step followed by etching. Beside the extra processing steps required, this approach leads again to unpredictable fusing.

However formed, the fusible links are subsequently blown out or fused by selectively applied currents.

Prior art references disclosing other types of ROM and their manufacture are U.S. Pat. Nos. 3,582,908 (a resistive ROM) and 3,245,051 (a diode ROM). These patents involve the formation of a matrix of components with selected crosspoints being blown out or destroyed by destructive current being passed therethrough. Such currents are often unpredictable and may, or may not, fuse the desired crosspoints. Moreover, the use of such currents may adversely affect components other than those which it is desired to affect.

SUMMARY OF THE INVENTION

The present invention contemplates the provision of a starting product for the production of a ROM and a method of producing both the starting product and the ROM. The present invention results in the production of ROMs which are cheap, easy to make, predictable in operation, and which involve no major additional processing steps over and above those normal photolithographic techniques used in the manufacture of multilayered electrical devices.

In general, the present invention contemplates formation of fusible links integral with conductive layers of a matrix of multilayered electrical devices. The links, which may be selectively blown out by the application of an appropriate current are formed by the controlled, rapid etching of selected portions of the conductive layers by an etchant which forms with the conductive layer and the semiconductor device an electrochemical or galvanic cell. Appropriate selection of the etchant results in conductive layers other than the selected ones being etched at a slower chemical rate.

The selected conductive layers are those that are in contact with doped regions in the semiconductive devices. Accordingly, an etchant is selected which forms an electrochemical or galvanic cell with respect to the material of the conductor and the material of doped semiconductor regions. Conveniently, if the semiconductor devices are covered with an insulating layer, the same etchant may be used to selectively etch windows through the insulating layer and to form the fusible links.

Additional objects and features of the invention will appear from the following description in which a preferred embodiment is set forth in detail, in conjunction with the accompanying drawings.

DETAILED DESCRIPTION

The present invention is described in conjunction with a type of semiconductor device known as a MOSFET, that is, a metal-oxide-semiconductor-field-effect transistor. This multilayered semiconductor structure is preferred in the practice of the present invention. However, other types of multilayered semiconductor structures may also be used in conjunction with the principles of the present invention to produce a ROM, as should be appreciated by those having skill in the art.

Figure 1:
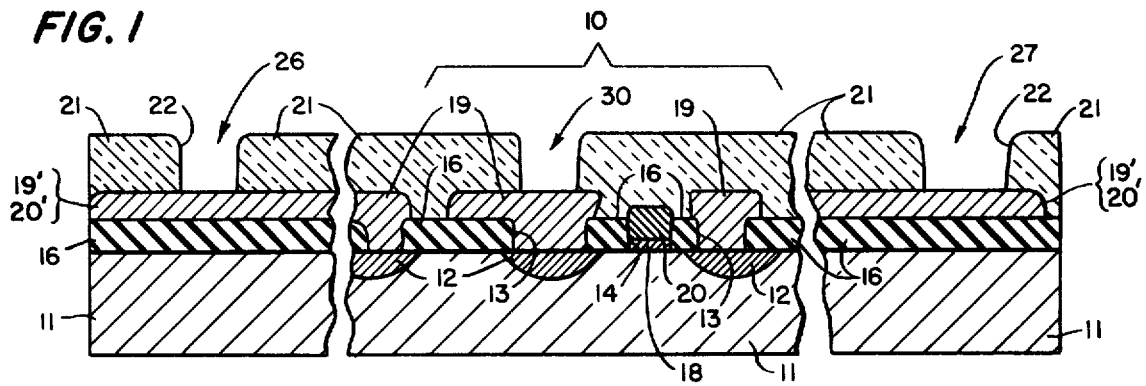
FIG. 1 is a cross-sectional, generalized view of a multilayered semiconductive structure from which the starting product of the present invention is generated by the method of this invention.

Referring first to FIG. 1, there is shown in cross-section a more or less standard MOS device 10. The device 10 is, in the preferred embodiment of this invention, only one device of a plurality of coplanar devices, preferably formed in matrix fashion.

The device 10, and all other like devices 10, is formed in a slice 11 of n-type silicon which has appreciably more breadth than is shown in FIG. 1. It is in the plane of this silicon sheet or slice 11 that all of the like MOS devices 10 are similarly formed.

Each device 10 includes a pair of doped or diffused regions 12. These regions 12 may result from the diffusion into the silicon slice 11 through an appropriate mask of a dopant such as boron. Defining apertures 13, which are generally central to each doped region 12, and an aperture 14, generally central to the area between the doped regions 12, is a layer 16 of an insulator such as silicon dioxide. The layer 16 has the apertures 13 and 14 defined therein by appropriate photolithographic techniques, as is well-known, and extends outward to the edges of the slice 11 as shown. The layer 16 may be doped with arsenic so that during processing steps involving heat, enhancement of the doped regions 12 occurs. The layer 16 is often referred to as the "thick oxide" or field oxide layer.

Each aperture 14 has, at its bottom, an oxide layer 18 completely covering the exposed surface of the silicon slice 11. This layer 18 is often referred to as the thin oxide, and is ultimately used to define the "gate electrode" of the MOS device 10.

Extending into the apertures 13 and then running out of those apertures 13 and onto the thick oxide 16 are conductive layers 19. The layers 19 are in contact with the doped regions 12 within the apertures 13 and are controlled electrodes (source and drain) of the devices 10. Preferably, the layers 19 are made of aluminum, although a wide variety of metallic substances may be used, as is well-known. An aluminum layer 20, serving as the gate electrode, is located over the thin oxide 18. The layers 19 and 20 may be deposited in a single operation and then be individually delineated by well-known photolithographic techniques.

At the edges of the slice 11 over the layer 16 are conductors 19', 20' which are used to connect the devices 10 to exterior circuitry. These conductors are formed as conductive busses or lines which are connected to selected electrodes 19, 20 of selected devices 10. Preferably, the conductors 19', 20' are continuations of, and are conformed with, the electrodes 19, 20.

Deposited over the entire structure described above, is an insulating layer 21, often termed a passivating layer. Preferably, this layer may be phosphrous-doped silicon dioxide. After deposition of the passivating layer 21, apertures 22 communicating with the conductors 19', 20' are opened by appropriate photolithographic techniques. Wires (not shown) are connectable to the devices 10 by bonding to contact pad terminations 26-28 of the conductors 19', 20' through the apertures 22.

Figure 2:
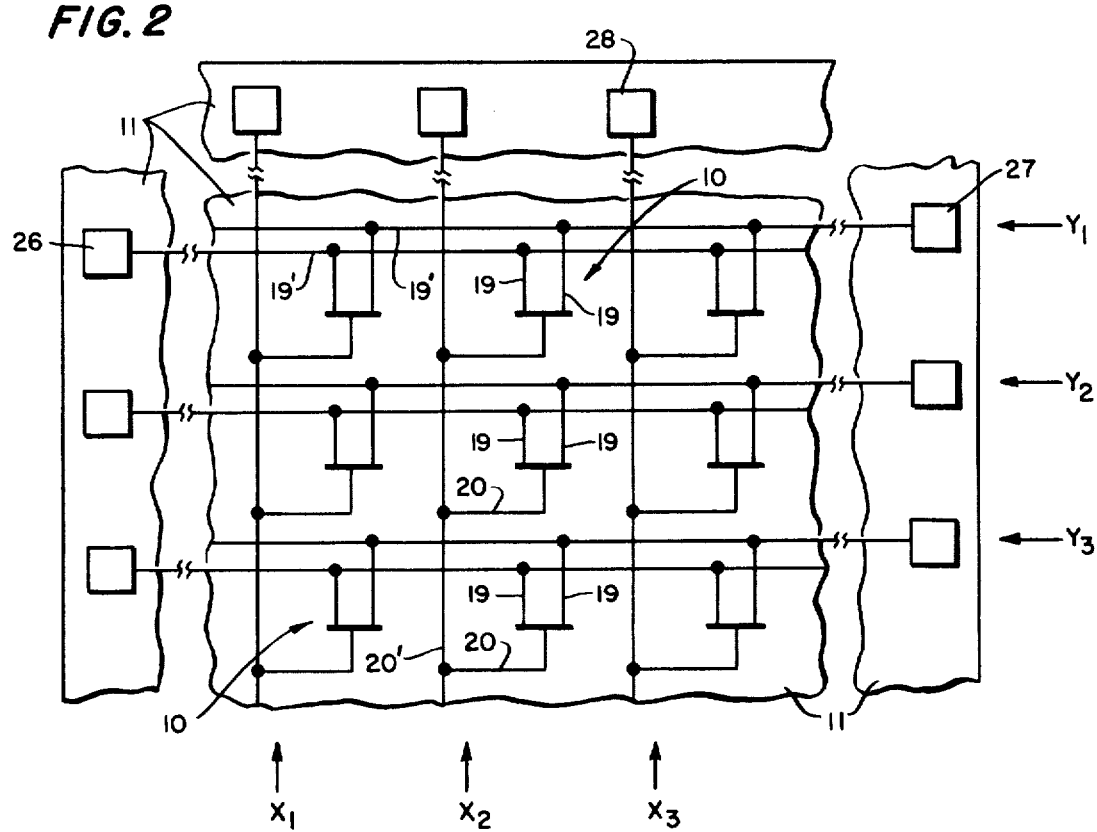
FIG. 2 is a generalized schematic of an array or matrix of the devices shown in FIG. 1.

All of the above is more or less standard and results in the production, over the slice of silicon 11, of a plurality of MOSFETs 10. If a matrix of the devices 10 is desired, the photolithographic sequence is so carried out that the schematic configuration of FIG. 2 is achieved. Specifically, the conductors 19', 20' are so formed as to interconnect one electrode 19, 20 of selected devices 10 in matrix fashion. More specifically, each source 19 of all devices 10 in rows $Y_1 - Y_3$ are respectively interconnected by conductors 19' which terminate in the pad 26. Each drain 19 of all devices 10 in the rows $Y_1 - Y_3$ are respectively interconnected by conductors 19' which terminate in the pad 27. Each gate electrode 20 of all devices 10 in columns $X_1 - X_3$ are respectively interconnected by conductors 20' which terminate in pads 28.

The devices 10 each comprise an MOS logic gate which exhibits either an "on" state or an "off" state. With the preferred materials described above, the MOSFET devices 10 operate on negative logic. That is, if no potential is applied to the gate electrode 20, the MOSFET remains "off" or in a "0" state, because there is a very high impedance path between the controlled electrodes 19 and, thus, between pads 26 and 27 in the row in which that device 10 resides. Application of a sufficient negative potential to the gate electrode 20 induces a conductive channel between the doped regions 12 beneath the thin oxide layer 18 so that the device 10 is now "on" or in a "1" state because of a low impedance path between the doped regions 12, the controlled electrodes 19 and the pads 26 and 27.

In accordance with the present invention, additional holes or apertures 30 are opened through the passivation layer 21 subsequent to its deposition. Preferably, these apertures 30 are opened only over one of the conductive layers or controlled electrodes 19 of each device 10, for example, the source electrode. The apertures 30 may be opened in a step separate from the openings 22 over the contact pads 26-28 or may be opened simultaneously therewith by means of an appropriate mask. Moreover, in some manufacturing sequences, it may be desirable to open additional apertures 30 over other controlled electrodes 19 of one or more devices 10 and the gate 20 of one or more devices 10.

Figure 3:
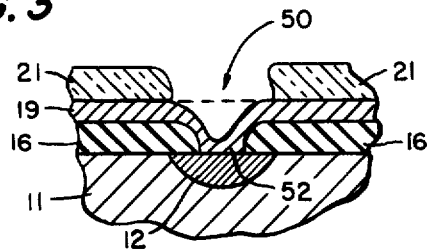
FIG. 3 is a detail of a portion of FIG. 1 showing the formation of a fusible link in accordance with the principles of the present invention.
Figure 4:
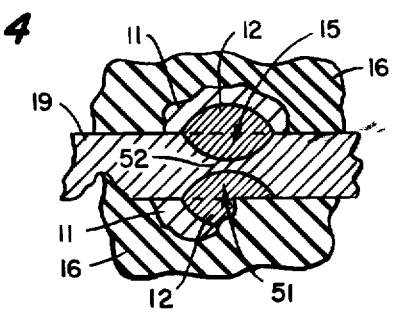
FIG. 4 is a top view of the same area of the semiconductor device which is shown in FIG. 3.

After the holes or apertures 30 are opened through the passivation layer 21, and referring now to FIGS. 3 and 4, the portion of the conductive layer 19 thus exposed is subjected to an appropriate etchant. The etchant is one which, when the entire slice 11 is immersed therein, forms an electrochemical or galvanic cell with the conductive layer 19, the doped region 12, and the slice 11. Formation of such an electrochemical or galvanic cell rapidly and controllably etches the portion of the conductive layer 19 so exposed. As shown in FIGS. 3 and 4, this results in both a thinning down of the conductive layer 19 as shown by the numeral 50, in vertical cross-section (FIG. 3), and also a necking down of the conductive layer 19 as shown by the numeral 51 from the top (FIG. 4). The thinned down and necked down areas 50 and 51 produce a fusible link 52, which requires far less $I^2R$ heating to be blown out than a conductive area which is merely necked down.

Preferably, where the passivation layer 21 is silicon dioxide, the slice 11 is silicon, and the doped regions 12 are boron-doped silicon, an etchant of aqueous, weak HF is used. HF is preferred because it is also an etchant for passivation layer 21.

Specifically, the etching through of the windows 30 through the passivation layer 21 and the formation of the fusible links 52 may be carried out as a continuous process. First, the slice 11 is immersed in the weak, aqueous HF solution. Such immersion causes the etching of the hole 30 via an appropriate etch mask (not shown). After the formation of the hole 30, the enhanced, accelerated and controlled attack of the exposed portion of the conductive layer 19 begins. Thus, the fusible links 52 may be formed in a single, continuous operation.

Where the conductive layers 19 are made of aluminum it has been found that a weak HF in aqueous solution etchant etches a portion of the metallic layer 19 in contact with the doped regions 12 at a rate of approximately 300 angstroms per second, while aluminum not contacting a doped region is etched at a rate of about 30 angstroms per second. Given the fact that the thickness of the aluminum layer 19 is approximately 15,000 angstrom units, a fusible link 52 may be formed by immersion of about 10 – 35 seconds. After formation of the fusible links 52, the apertures 30 have redeposited therein passivation material which may again be silicon dioxide.

It should be noted that the above method is especially useful for MOS devices, which have rarely up to now embodied fusible links. The reason for this, as described earlier, is that in the prior art MOSFET matrices, the magnitude of current necessary to blow a fusible link is sufficiently high to either damage some devices 10 or to cause the fusing of the conductive layer 19 at points other than desired. The use of the above method causes an extreme thinned down and necked down fusible link 52 which has a sufficiently high resistance so that reasonable currents may be used to generate sufficient $I^2R$ heating therein for blowing of desired fusible links.

After formation of the fusible links 52 the entire array or matrix may then be used to produce a ROM. ROM formation may be performed either by the manufacturer of the basic starting product described above in which all of at least one of the controlled electrodes of each device 10 has a fusible link 52 formed therein or may be performed by the ultimate user.

In brief, and in the preferred embodiment where only one controlled electrode has a fusible link 52 formed therein, all of the pads 26 are connected to selectively energizable source of current. All of the pads 27 are grounded, and the pads 28 are connected to a selectively energizable negative potential source.

Next, the negative potential is applied to those pads 28 which are connected to devices 10 wherein it is desired to permanently store a "0". All of the pads 26 associated with these devices 10 have a current applied thereto sufficient to fuse the fusible link 52. Such energization induces the channel, described above, to permit the low impedance path between the controlled electrodes 19 while the current source creates the $I^2R$ heating in the selected fusible links 52 to open these links and permanently store a "0" in selected devices 10.

Because many changes and modifications may be made without departing from the spirit and scope of the claims herein, it is intended that all matter in the above specification shall be considered as illustrative only and not in a limiting sense.

What is claimed is:

1. A method of forming a ROM from a matrix of semiconductive devices which each include a plurality of electrodes, at least one of which electrodes in each device includes a metallic conductor in contact with a doped semiconductor region, wherein the method comprises:
   rapidly decreasing the cross-sectional area of selected ones of the conductors in contact with doped regions with an etchant which forms, with the conductor and the doped region, an electrochemcial cell; conductors not in contact with the doped regions etching at a slower, chemical rate; and then
   passing sufficient current through selected conductors to fuse the decreased cross-sectional area thereof.

2. The ROM produced by the method of claim 1.

3. The method of claim 1, wherein the devices are MOSFETS coplanarly formed in a slice of the silicon, the slice being covered by a layer of $SiO_2$ after deposition of the aluminum conductors, wherein the method further comprises,
   etching windows in the $SiO_2$ layer to expose therethrough selectea conductors in each device.

4. The ROM produced by the method of claim 3.

5. The method of claim 3 wherein
   the windows are etched with the same etchant as that which effects the decrease in conductor cross-sectional area.

6. The method of claim 5, wherein
   the semiconductor is silicon,
   the dopant is boron,
   the metal is deposited aluminum,
   the etchant is unbuffered HF and $H_2O$.

7. The ROM produced by the method of claim 6.

8. A method of forming a ROM from a plurality of coplanar MOS devices, the insulated gates of each of which are connected to a selected one of a plurality of column conductors, each device including a pair of controlled electrodes each in contact with a doped region of a semiconductor, one of the controlled electrodes of each device being connected to a selected one of a plurality of row conductors, the other controlled electrode being grounded, wherein the method comprises:
   rapidly decreasing the cross-sectional area of the controlled electrodes adjacent the doped regions by contacting the electrodes with an etchant which forms an electrochemical cell with the electrode and the doped semiconductor, portions of the electrodes not in contact with the doped regions etching at a slower, chemical rate; and then
   applying voltages to selected row and column conductors sufficient to blow selected controlled electrodes.

9. The ROM produced by the method of claim 8.

10. An improved method of decreasing the cross-sectional area of selected conductors associated with doped semiconductor regions of an array of semiconductive devices, preparatory to blowing out predetermined ones of the selected cross-sectionally decreased conductors by $I^2R$ heating, wherein the improvement comprises:
    contacting the selected conductors and their associated doped regions with a first etchant which forms an electrochemical cell with the conductors and the regions, to rapidly etch and decrease the cross-sectional area thereof.

11. The product produced by the method of claim 10.

12. The method of claim 10 wherein other conductors not associated with doped regions are also contacted with the etchant, the other conductors being etched at a chemical rate, slower than the rate of etching of the selected conductors.

13. The method of claim 10 wherein
the conductors are aluminum,
the doped semiconductor regions are boron-doped silicon, and
the etchant is unbuffered HF and $H_2O$.

14. The method of claim 10 wherein the array is covered with an insulating layer, which method further comprises
etching the insulating layer with a second etchant to open windows therethrough to thereby expose the doped regions and their associated selected conductors.

15. The method of claim 14 wherein
the conductors are aluminum,
the doped semiconductor regions are boron-doped silicon,
the insulating layer is $SiO_2$, and
the first and second etchant are both unbuffered HF and $H_2O$.

16. The product produced by the method of claim 15.

17. A method of producing a ROM from the product of claim 16 comprising the step of
blowing out predetermined ones of the selected cross-sectionally decreased conductors by the $I^2R$ heating.

18. The method of claim 15 wherein
the contacting step immediately follows the etching step by the continuous application of unbuffered HF and $H_2O$.

* * * * *